US012563702B2

(12) United States Patent
Chuang et al.

(10) Patent No.: US 12,563,702 B2
(45) Date of Patent: Feb. 24, 2026

(54) ELECTRONIC DEVICE

(71) Applicants: Chih-Yuan Chuang, Taipei (TW);
Po-Jui Huang, Taipei (TW);
Chien-Sheng Lan, Taipei (TW)

(72) Inventors: Chih-Yuan Chuang, Taipei (TW);
Po-Jui Huang, Taipei (TW);
Chien-Sheng Lan, Taipei (TW)

(73) Assignee: COMPAL ELECTRONICS, INC.,
Taipei (TW)

( * ) Notice: Subject to any disclaimer, the term of this
patent is extended or adjusted under 35
U.S.C. 154(b) by 242 days.

(21) Appl. No.: 18/408,603

(22) Filed: Jan. 10, 2024

(65) Prior Publication Data

US 2025/0133700 A1     Apr. 24, 2025

Related U.S. Application Data

(60) Provisional application No. 63/544,951, filed on Oct.
20, 2023.

(51) Int. Cl.
H05K 7/20     (2006.01)
G06F 1/16     (2006.01)
G06F 1/20     (2006.01)
(52) U.S. Cl.
CPC .......... H05K 7/2039 (2013.01); G06F 1/166
(2013.01); G06F 1/203 (2013.01)
(58) Field of Classification Search
CPC .......... G06F 1/203; G06F 1/1616; G06F 1/20;
G06F 1/166; G06F 1/181; G06F 1/16;
(Continued)

(56) References Cited

U.S. PATENT DOCUMENTS 6,437,978 B1 *   8/2002   Ozaki ..................... G06F 1/203
                                                          400/82
6,459,573 B1 *  10/2002   DiStefano ............... G06F 1/203
                                                          361/679.46
(Continued)

FOREIGN PATENT DOCUMENTS

CN          102131358 B  *  3/2013
CN          112099595       12/2020
(Continued)

OTHER PUBLICATIONS

"Office Action of Taiwan Counterpart Application", issued on Aug.
26, 2024, p. 1-p. 7.
(Continued)

*Primary Examiner* — Michael A Matey
(74) *Attorney, Agent, or Firm* — JCIPRNET

(57)     ABSTRACT
An electronic device includes a logic body, a processing
unit, and a bracket component. The logical body has a
plurality of first end openings and a plurality of first bottom
openings. The first end openings are disposed at a first end
portion of the logic body. The first bottom openings are
disposed at a bottom portion of the logic body and are
adjacent to the first end portion. The processing unit is
disposed in an interior of the logic body, away from the first
end openings, and misaligned with the first bottom openings.
The bracket component is rotatably disposed at the bottom
portion. In a closed mode, the bracket component is posi-
tioned close to the bottom portion and covers the first bottom
openings. In an open mode, the bracket component is
unfolded from the bottom portion and exposes the first
bottom openings.

21 Claims, 16 Drawing Sheets

(58) Field of Classification Search
CPC .... G06F 1/1601; G06F 1/1633; G06F 1/1677;
G06F 1/206; G06F 2200/201; H05K
7/20136; H05K 5/0217; H05K 7/20145;
H05K 7/2039; H05K 5/0213; H05K 7/20;
H05K 7/20127; H05K 7/20209; H05K
7/20154; H05K 7/20172; H05K 9/0041
See application file for complete search history.

(56)             References Cited

U.S. PATENT DOCUMENTS

| | | | | |
|---|---|---|---|---|
| 6,599,090 | B2 * | 7/2003 | Ozaki | G06F 1/203 |
| | | | | 415/206 |
| 7,193,848 | B2 * | 3/2007 | Peng | G06F 1/1656 |
| | | | | 361/679.55 |
| 7,310,227 | B2 * | 12/2007 | Kusamoto | G06F 1/203 |
| | | | | 361/689 |
| 7,764,514 | B2 * | 7/2010 | Mongia | H05K 9/0041 |
| | | | | 174/382 |
| 9,317,064 | B2 * | 4/2016 | Wu | G06F 1/1616 |
| 2002/0018337 | A1 * | 2/2002 | Nakamura | G06F 1/1616 |
| | | | | 361/697 |
| 2004/0125558 | A1 * | 7/2004 | DiStefano | G06F 1/203 |
| | | | | 361/679.48 |
| 2004/0212958 | A1 * | 10/2004 | Jones | G06F 1/203 |
| | | | | 312/223.2 |
| 2009/0021910 | A1 | 1/2009 | Lai et al. | |
| 2009/0147469 | A1 * | 6/2009 | Chen | G06F 1/166 |
| | | | | 361/679.55 |
| 2009/0147477 | A1 * | 6/2009 | Chao | G06F 1/203 |
| | | | | 361/697 |
| 2010/0079947 | A1 * | 4/2010 | Aoki | G06F 1/203 |
| | | | | 361/695 |

| | | | | |
|---|---|---|---|---|
| 2010/0167636 | A1 * | 7/2010 | Bhattacharya | G06F 1/206 |
| | | | | 454/239 |
| 2011/0043995 | A1 * | 2/2011 | Chen | G06F 1/203 |
| | | | | 361/679.55 |
| 2015/0062805 | A1 * | 3/2015 | Katsumata | F28F 13/06 |
| | | | | 361/679.49 |
| 2017/0153677 | A1 * | 6/2017 | Cheng | G06F 1/1637 |
| 2017/0168529 | A1 * | 6/2017 | Wilson | G06F 1/1615 |
| 2019/0278345 | A1 * | 9/2019 | Ye | H05K 5/0234 |
| 2020/0337179 | A1 * | 10/2020 | Ku | G06F 1/206 |
| 2021/0089077 | A1 * | 3/2021 | Wang | G06F 1/3287 |
| 2021/0286416 | A1 * | 9/2021 | Huang | G06F 1/1616 |
| 2022/0256732 | A1 * | 8/2022 | Wu | H02J 7/0044 |
| 2022/0382345 | A1 * | 12/2022 | Chen | H05K 7/2039 |
| 2024/0028092 | A1 | 1/2024 | Cho et al. | |
| 2024/0098932 | A1 * | 3/2024 | Sun | G06F 1/203 |

FOREIGN PATENT DOCUMENTS

| | | | | | |
|---|---|---|---|---|---|
| CN | 112099595 | A | * | 12/2020 | G06F 1/203 |
| CN | 114115452 | A | * | 3/2022 | G06F 1/203 |
| CN | 117093054 | A | * | 11/2023 | G06F 1/203 |
| CN | 119521600 | A | * | 2/2025 | H05K 7/20136 |
| TW | 506246 | | | 10/2002 | |
| TW | I391813 | | | 4/2013 | |
| TW | M519877 | | | 4/2016 | |
| TW | I790009 | | | 1/2023 | |
| TW | I790009 | B | * | 1/2023 | |

OTHER PUBLICATIONS

"Office Action of Taiwan Related Application, Application No.
112146942", issued on Jun. 11, 2024, p. 1-p. 8.
"Office Action of U.S. Related Application, U.S. Appl. No. 18/408,600",
issued on Nov. 17, 2025, p. 1-p. 24.

* cited by examiner

BP(110)    134    131(130)    E1

BG

B

100

134                    130

IS

H1

100

ELECTRONIC DEVICE

CROSS-REFERENCE TO RELATED APPLICATION

This application claims the priority benefit of U.S. provisional application Ser. No. 63/544,951, filed on Oct. 20, 2023. The entirety of the above-mentioned patent application is hereby incorporated by reference herein and made a part of this specification.

BACKGROUND

Technical Field

The disclosure relates to an electronic device, and particularly relates to an electronic device capable of improving heat dissipation efficiency.

Description of Related Art

In response to the escalating demand for heightened performance of a conventional electronic device, such as a laptop or a tablet, there has been an increase in the generation of waste heat during the operation of the electronic device. A heat source of the conventional electronic device, such as a central processing unit, a graphics processing unit, and a hard drive, are mostly installed inside a logic body, where the built-in heat dissipation fin is positioned to make contact with the heat source and absorbs energy of the heat source, and ambient cold air is drawn into the logic body by a fan to engage in a heat exchange with the heat dissipation fin to dissipate heat.

In an existing laptop, the logic body is elevated by a plurality of food pads to create a gap between the logic body and a plane, which provides space for air circulation. However, the gap raised by the foot pads is excessively small, resulting in insufficient air flow. Therefore, a user resorts to employing an external heat dissipation bracket and positioning the laptop on the heat dissipation bracket to enhance heat dissipation efficiency. Nevertheless, the bulky volume of the existing external heat dissipation bracket poses challenges to user portability.

SUMMARY

The disclosure provides an electronic device where an orientation of a bracket is adjustable according to usage requirements, so that the electronic device may switch to a closed mode or an open mode. In the open mode, the heat dissipation efficiency may be improved, and an included angle of the electronic device is adjustable to be ergonomically sound.

In an embodiment of the disclosure, an electronic device including a logic body, a processing unit, and a bracket component is provided. The logic body has a plurality of first end openings and a plurality of first bottom openings. The first end openings are disposed at a first end portion of the logic body, and the first bottom openings are disposed at a bottom portion of the logic body and are adjacent to the first end portion. The processing unit is disposed in an interior of the logic body, away from the first end openings, and misaligned with the first bottom openings. The bracket component is rotatably disposed at the bottom portion. In a closed mode, the bracket component is positioned close to the bottom portion and covers the first bottom openings. In an open mode, the bracket component is unfolded from the bottom portion and exposes the first bottom openings.

Based on the above, the electronic device provided in one or more embodiments of the disclosure adopts the bracket component. In the closed mode, the bracket component is positioned close to the bottom portion to reduce the volume, and the electronic device is adapted to low-performance usage scenarios, such as browsing webpages or watching videos. In the open mode, the bracket component is unfolded from the bottom portion to increase the space for heat dissipation, and the electronic device is adapted to full-performance usage scenarios, such as gaming, drawing or programming.

To be specific, when the logic body is elevated by the bracket component, an included angle between the logic body and the plane is ergonomically sound, allowing the user to use a keyboard of the logic body for extended periods.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
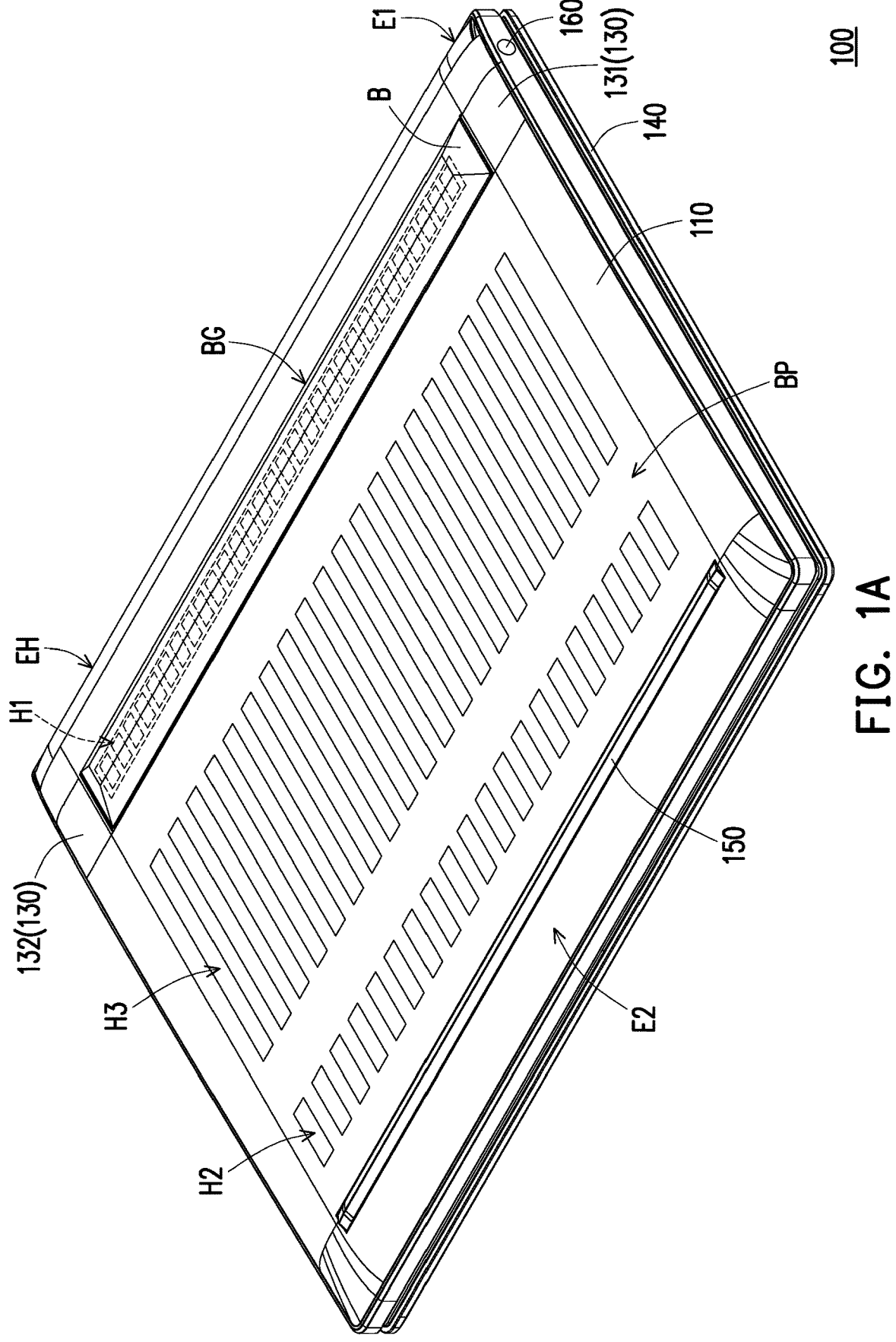
FIG. 1A is a schematic three-dimensional diagram of an electronic device in a closed mode according to an embodiment of the disclosure.
Figure 1B:
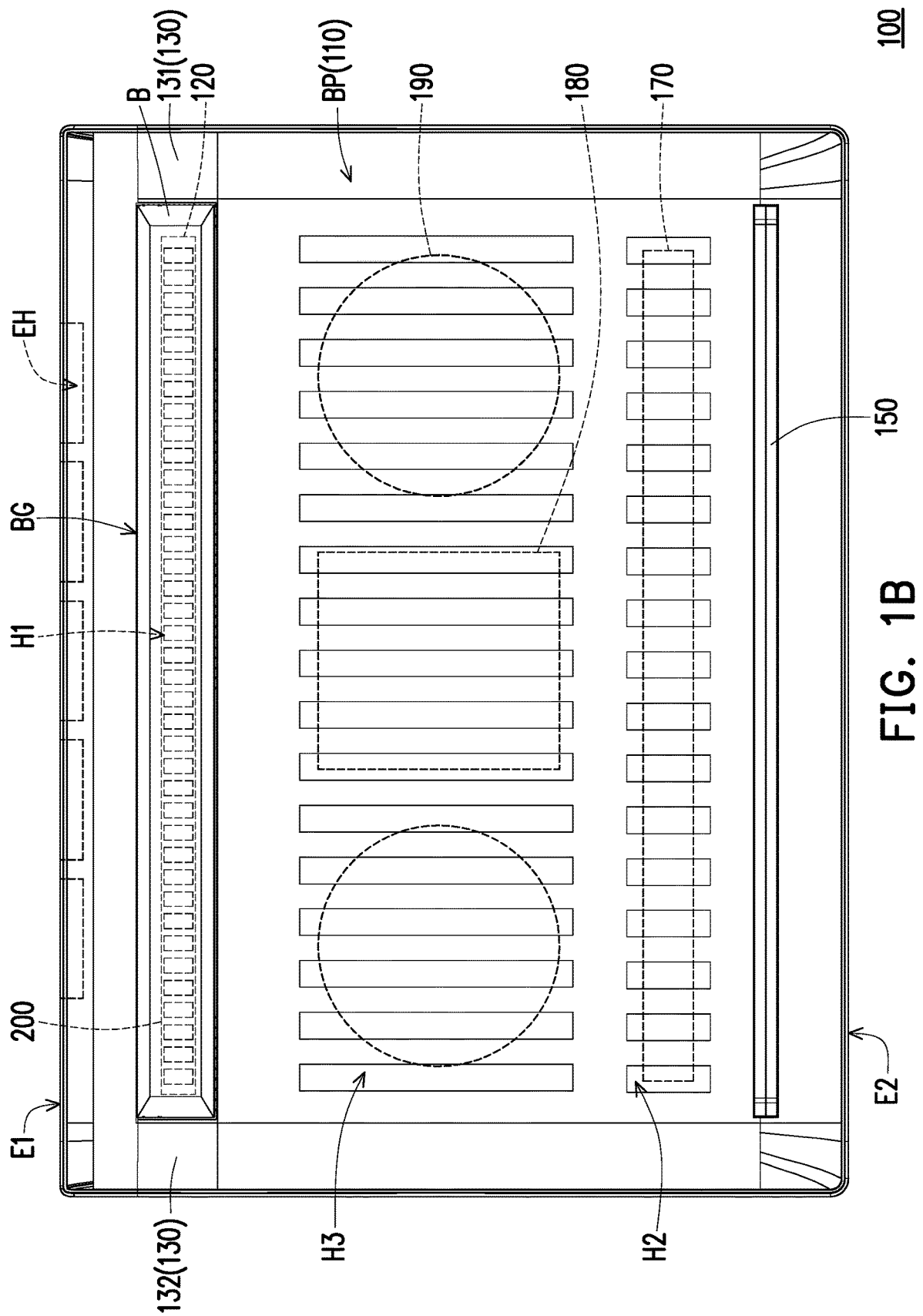
FIG. 1B is a schematic perspective plan view of some elements of the electronic device in the closed mode in FIG. 1A.

With reference to FIG. 1A and FIG. 1B, an electronic device provided in this embodiment is, for instance, a laptop, a tablet, a server, a home console, a desktop computer, a personal computer, an artificial intelligence personal computer (AI PC), or any other similar electronic equipment.

An electronic device 100 provided in an embodiment of the disclosure includes a logic body 110, a heat dissipation fin 120, and a bracket component 130.

Figure 1C:
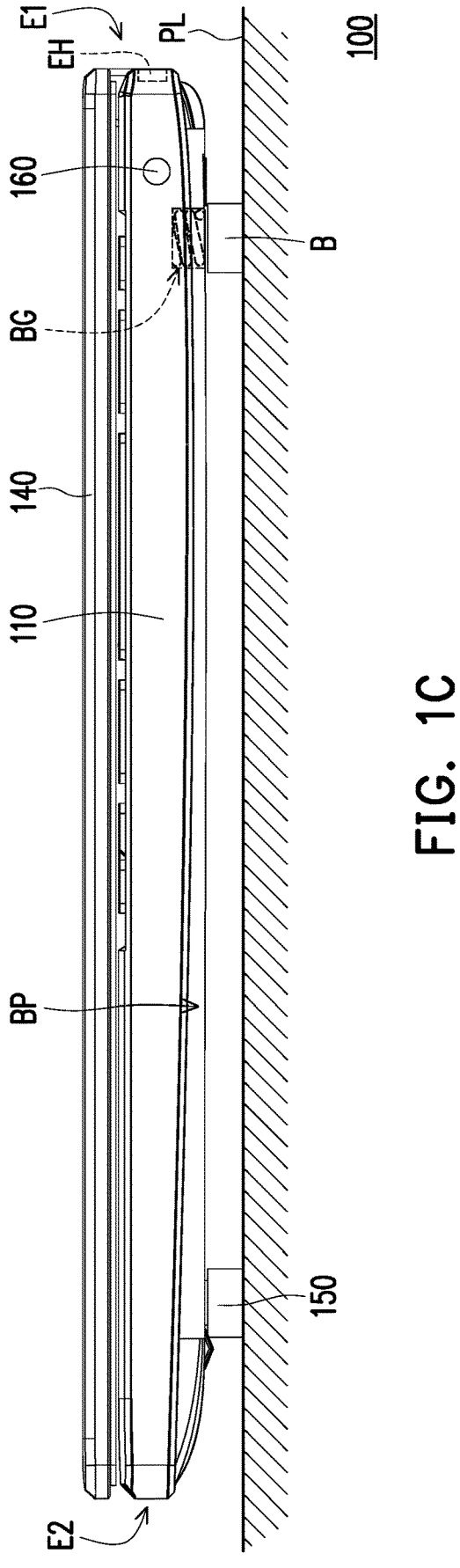
FIG. 1C is a schematic side plan view of the electronic device in the closed mode in FIG. 1A.
Figure 1D:
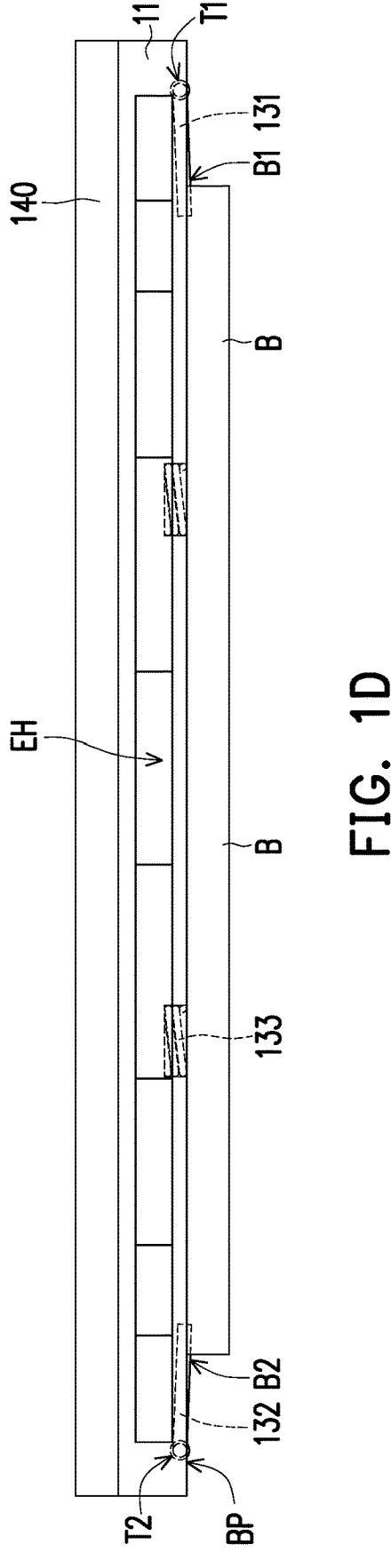
FIG. 1D is a schematic rear plan view of the electronic device in FIG. 1C.

With reference to FIG. 1A, FIG. 1B, and FIG. 1D, the logic body 110 has a plurality of first end openings EH and a plurality of first bottom openings H1. The first end openings EH are disposed at a first end portion E1 of the logic body 110, where the first end openings EH serve as exhaust vents and are configured to expel hot air from the interior of the logic body 110. In practical applications, a first end portion E1 may be close to the user end, close to a pivot end, a left end, or a right end, which should however not be construed as a limitation in the disclosure. The first bottom openings H1 are disposed at a bottom portion BP of the logic body 110 and are adjacent to the first end portion E1, where the first bottom openings H1 serve as intake vents and configured to draw in ambient cold air into the logic body 110.

With reference to FIG. 1B, a heat dissipation fin 120 is disposed in an interior IS of the logic body 110 and corresponds to the first bottom openings H1. The bracket component 130 is rotatably disposed at the bottom portion BP.

With reference to FIG. 1A to FIG. 1C, in a closed mode, the bracket component 130 is positioned close to the bottom portion BP and covers the first bottom openings H1, where there is a gap between the bracket component 130 and the bottom portion BP of the logic body 110.

Figure 1E:
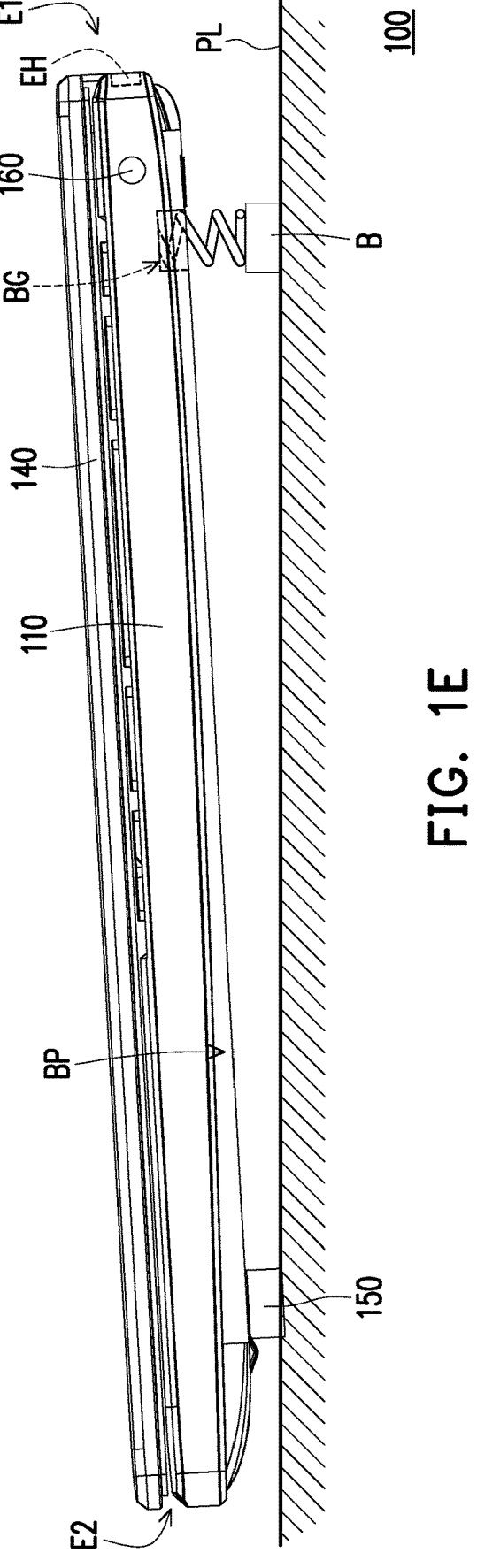
FIG. 1E is a schematic side plan view illustrating the electronic device in FIG. 1A is switched to the open mode.

With reference to FIG. 1D and FIG. 1E, in an open mode, the bracket component 130 is unfolded from the bottom portion BP and exposes the first bottom openings H1. Particularly, in the open mode, the bracket component 130 has a shorter length, and therefore a flipping stroke of the bracket component 130 is also shorter, and an angle at which the logic body 110 is elevated is smaller, thus making the angle between the logic body 110 and the plane PL ergonomic and allowing users to use the keyboard of the logic body for extended periods.

To be specific, the electronic device 100 further includes a display body 140 and a plurality of foot pads 150. The display body 140 is detachably disposed at the first end portion E1. The foot pads 150 are disposed at the bottom portion BP and are away from the first end portion E1, where the foot pads are made of a rubber material.

Particularly, the display body 140 includes a display panel or a touch display panel. The display panel is a liquid crystal display panel, a light-emitting diode display panel, an organic light-emitting diode display panel, or an electrophoretic display panel. The touch display panel is a capacitive touch display panel, a resistive touch display panel, an optical touch display panel, or an acoustic wave touch display panel.

Figure 1F:
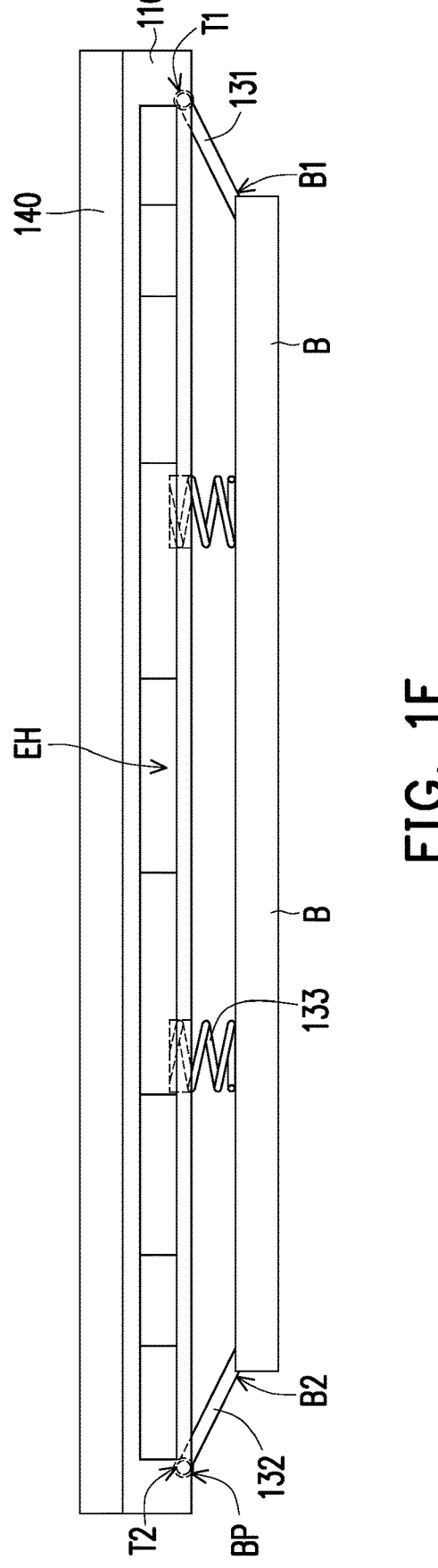
FIG. 1F is a schematic rear plan view of the electronic device in FIG. 1E.

With reference to FIG. 1D, the logic body 110 has a bottom groove BG surrounding the first bottom openings H1. With reference to FIG. 1A, FIG. 1C, and FIG. 1D, in a closed mode, the bracket component 130 is accommodated in the bottom groove BG to cover the first bottom openings H1. With reference to FIG. 1E and FIG. 1F, in an open mode, the bracket component 130 is unfolded from the bottom groove BG relative to the logic body 110 and is away from the bottom groove BG.

With reference to FIG. 1A and FIG. 1B, the logic body 110 has a plurality of second bottom openings H2 away from the first bottom openings H1. Specifically, the second bottom openings H2 are disposed at the bottom portion BP of the logic body 110 and positioned close to a second end portion E2 opposite to the first end portion E1. The logic body 110 further includes a storage unit 170 disposed in the interior IS and corresponding to the second bottom openings H2. The storage unit 170 is a memory or a hard disk, and the second bottom openings H2 serve as intake vents for drawing ambient cold air into the logic body 110.

With reference to FIG. 1A and FIG. 1B, the logic body 110 has a plurality of third bottom openings H3 adjacent to the first bottom openings H1. The third bottom openings H3 serve as intake vents for drawing ambient cold air into the logic body 110. Specifically, the third bottom openings H3 are located between each of the first bottom openings H1 and each of the second bottom openings H2.

With reference to FIG. 1A and FIG. 1B, a size of each of the first bottom openings H1 is smaller than a size of each of the third bottom openings H3, and a size of each of the second bottom openings H2 is smaller than the size of each of the third bottom openings H3. An aperture ratio of the first bottom openings H1 is smaller than an aperture ratio of the third bottom openings H3, and an aperture ratio of the second bottom openings H2 is smaller than the aperture ratio of the third bottom openings H3.

Besides, since the bracket component 130 is aligned with the first bottom openings H1, in the closed mode, the bracket component 130 does not cover the third bottom openings H3 nor the second bottom openings H2, which indicates that the third bottom openings H3 and the second bottom openings H2 are always exposed to the bottom portion BP of the logic body 110 regardless of being in the closed mode or the open mode.

In other embodiments, the bottom groove surrounds the second bottom openings and/or the third bottom openings. The size and the orientation of the bottom groove may be adjusted according to structural requirements, and the size and the orientation of the bracket component 130 may also be changed together with the bottom groove.

With reference to FIG. 1C, FIG. 1E, and FIG. 1F, a stopper B is pivoted to the bracket component 130 and is disposed at the bottom portion BP. A material of the bracket component 130 and the stopper B includes plastic, rubber, or a combination of plastic and rubber. Specifically, the stopper B is movably disposed at the bottom portion BP and is aligned with the first bottom openings H1. The bracket component 130 is configured to drive the stopper B to be spaced from the bottom portion BP. In the closed mode, the stopper B protrudes from the bottom portion BP and is configured to prevent hot air discharged from the first end openings EH from flowing back to the first bottom openings H1.

In other embodiments, the stopper is disposed between the first end openings and the first bottom openings, or the first bottom openings are disposed between the first end openings and the stopper.

With reference to FIG. 1A to FIG. 1C, the bracket component 130 includes a first bracket 131, a second bracket 132, and a plurality of elastic elements 133. Both ends of the first bracket 131 are respectively connected to the bottom portion BP and the stopper B. Both ends of the second bracket 132 are respectively connected to the bottom portion BP and the stopper B. Both ends of each of the elastic elements 133 are respectively connected to the bottom portion BP and the stopper B, and each of the elastic elements 133 is disposed between the first bracket 131 and the second bracket 132. Specifically, a first top end T1 of the first bracket 131 is pivoted to the bottom portion BP, and a first bottom end B1 of the first bracket 131 is pivoted to the stopper B; a second top end T2 of the second bracket 132 is pivoted to the bottom portion BP, and a second bottom end B2 of the second bracket 132 is pivoted to the stopper B. The bracket component 130 is located between the third bottom openings H3 and the first end openings EH.

With reference to FIG. 1C and FIG. 1D, in the closed mode, the first bracket 131 and the second bracket 132 are positioned close to the bottom portion BP, and the first bracket 131 and the second bracket 132 are unfolded from the stopper B; that is, an included angle between the first bracket 131 and the second bracket 132 relative to the stopper B increases. With reference to FIG. 1E and FIG. 1F, in the open mode, the first bracket 131 and the second bracket 132 are unfolded from the bottom portion BP, and the first bracket 131 and the second bracket 132 are folded to the stopper B; that is, an included angle between the first bracket 131 and the second bracket 132 relative to the stopper B decreases.

With reference to FIG. 1A, FIG. 1C, and FIG. 1E, the electronic device 100 further includes a release button 160 disposed on one side of the logic body 110 and linked to the elastic elements 133. When the release button 160 is pressed by an external force, limit on the elastic elements 133 is released, and the elastic elements 133 are elastically restored to drive the bracket component 130 and the stopper B to be unfolded from the bottom portion BP of the logic body 110, thereby automatically switching to the open mode for elevating the logic body 110 and increasing the air intake of the first bottom openings H1.

With reference to FIG. 1B, the logic body 110 further includes a processing unit 180 and a heat dissipation fan 190, both of which are disposed in the interior IS and correspond to the third bottom openings H3. The processing unit 180 is, for instance, a central processing unit (CPU), a graphics processing unit (GPU), a data processing unit (DPU), a visual processing unit (VPU), a tensor processing unit (TPU), or a neural network processing unit (NPU). Here, the heat dissipation fan 190 is a radial heat dissipation fan or an axial heat dissipation fan.

With reference to FIG. 1A and FIG. 1B, the logic body 110 further includes at least one mesh element 200 correspondingly disposed in at least one of the first bottom openings H1, the second bottom openings H2, and the third bottom openings H3. In this embodiment, the mesh element 200 is disposed in the bottom groove BG and covers the first bottom openings H1. The mesh element 200 achieves effects of filtering dust, shielding, and protecting internal elements.

Figure 2A:
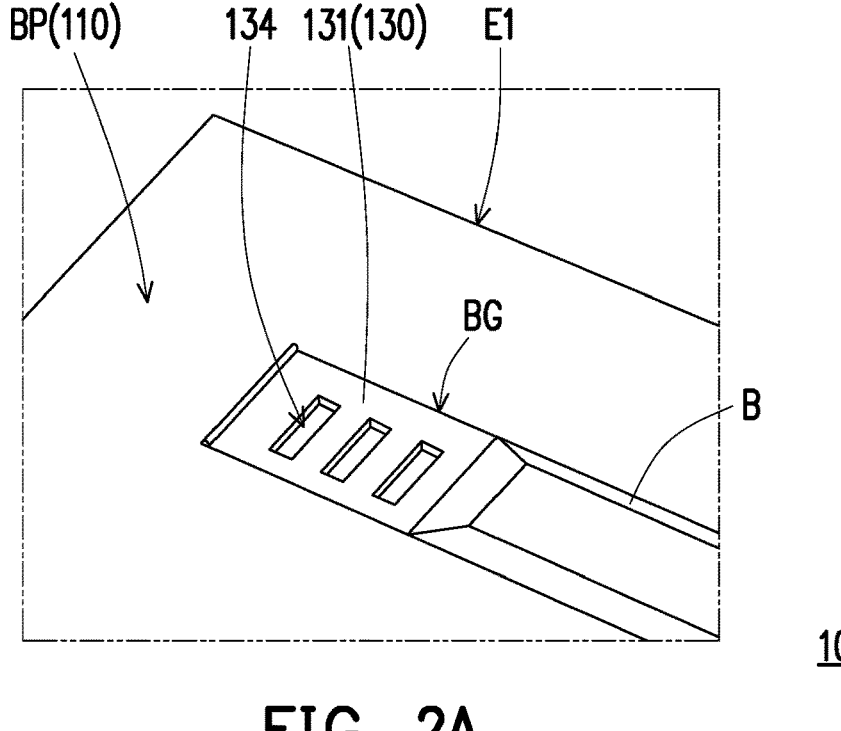
FIG. 2A is a schematic plan view of a bracket component of an electronic device with an increased number of grid-like perforations according to another embodiment of the disclosure.
Figure 2B:
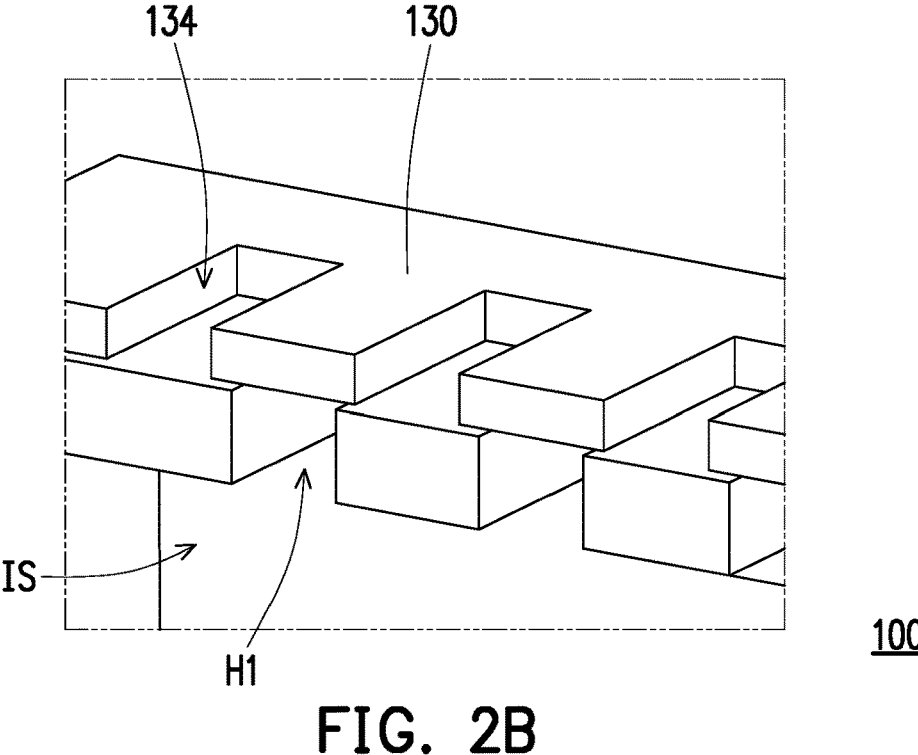
FIG. 2B is a schematic three-dimensional cross-sectional view of some elements of the electronic device in FIG. 2A.

FIG. 2A is a schematic plan view of a bracket component of an electronic device with an increased number of grid-like perforations according to another embodiment of the disclosure. FIG. 2B is a schematic three-dimensional cross-sectional view of some elements of the electronic device in FIG. 2A.

With reference to FIG. 2A and FIG. 2B, the bracket component 130 provided in this embodiment has a plurality of grid-like perforations 134, and a material of the bracket component 130 may include plastic or metal. In the closed mode, there is a gap between the bracket component 130 and the bottom portion BP, and the grid-like perforations 134 are misaligned with the first bottom openings H1. With reference to FIG. 1E and FIG. IF, in the open mode, the bracket component 130 is unfolded from the bottom portion BP and drives the grid-like perforations 134 to be away from the first bottom openings H1.

To be specific, when the bracket component 130 is folded to the bottom portion BP of the logic body 110, the external cold air may enter the interior IS of the logic body 110 through the grid-like perforations 134 and the first bottom openings H1 to reduce the internal temperature of the logic body 110. Therefore, in the closed mode, the logic body provided in this embodiment still achieves a favorable heat dissipation effect compared to the logic body that does not adopt the grid-like perforations 134. In addition, since the grid-like perforations 134 are misaligned with the first bottom openings H1, the first bottom openings H1 are shielded by the bracket component 130, which results in a special appearance design.

Figure 3A:
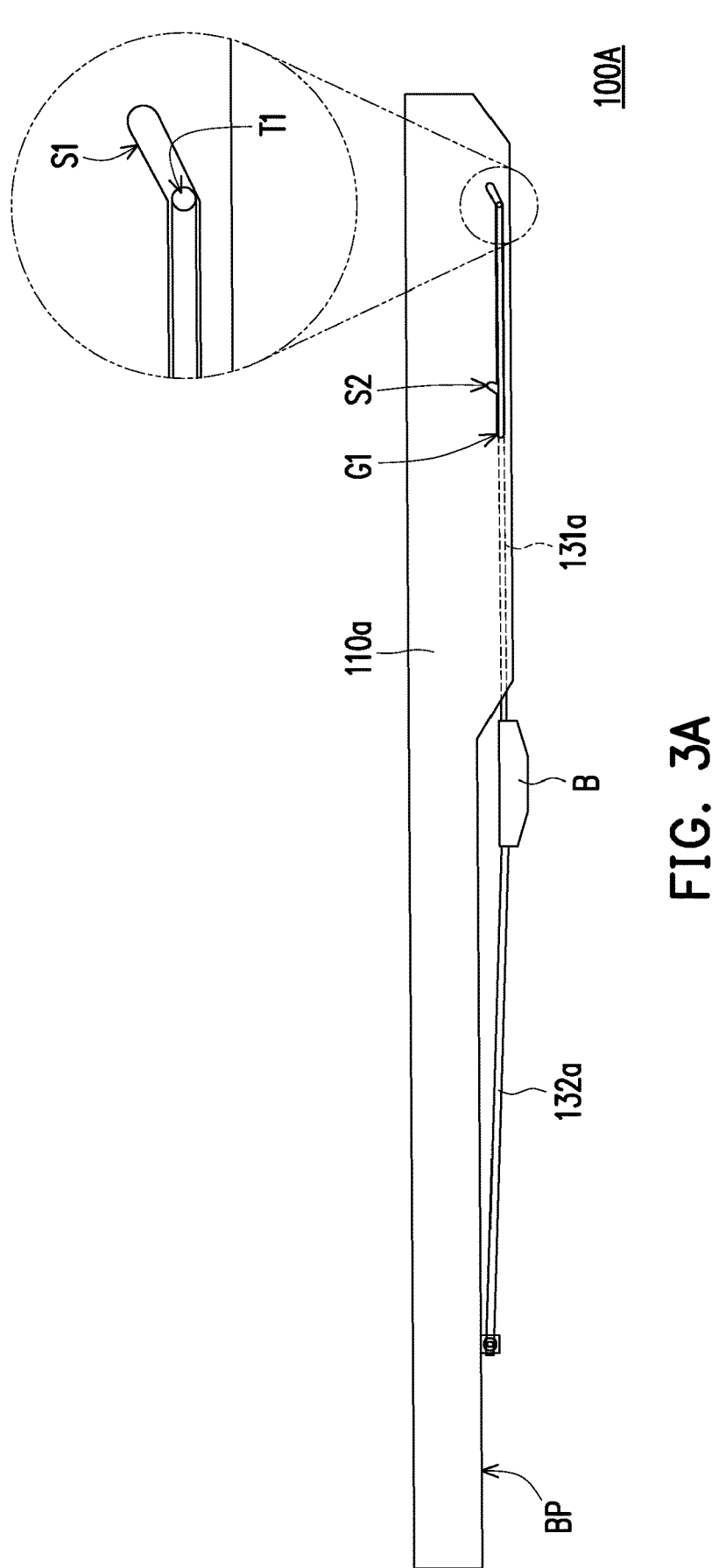
FIG. 3A is a schematic side view of a bracket component of an electronic device combined with a first sliding rail according to another embodiment of the disclosure.
Figure 3B:
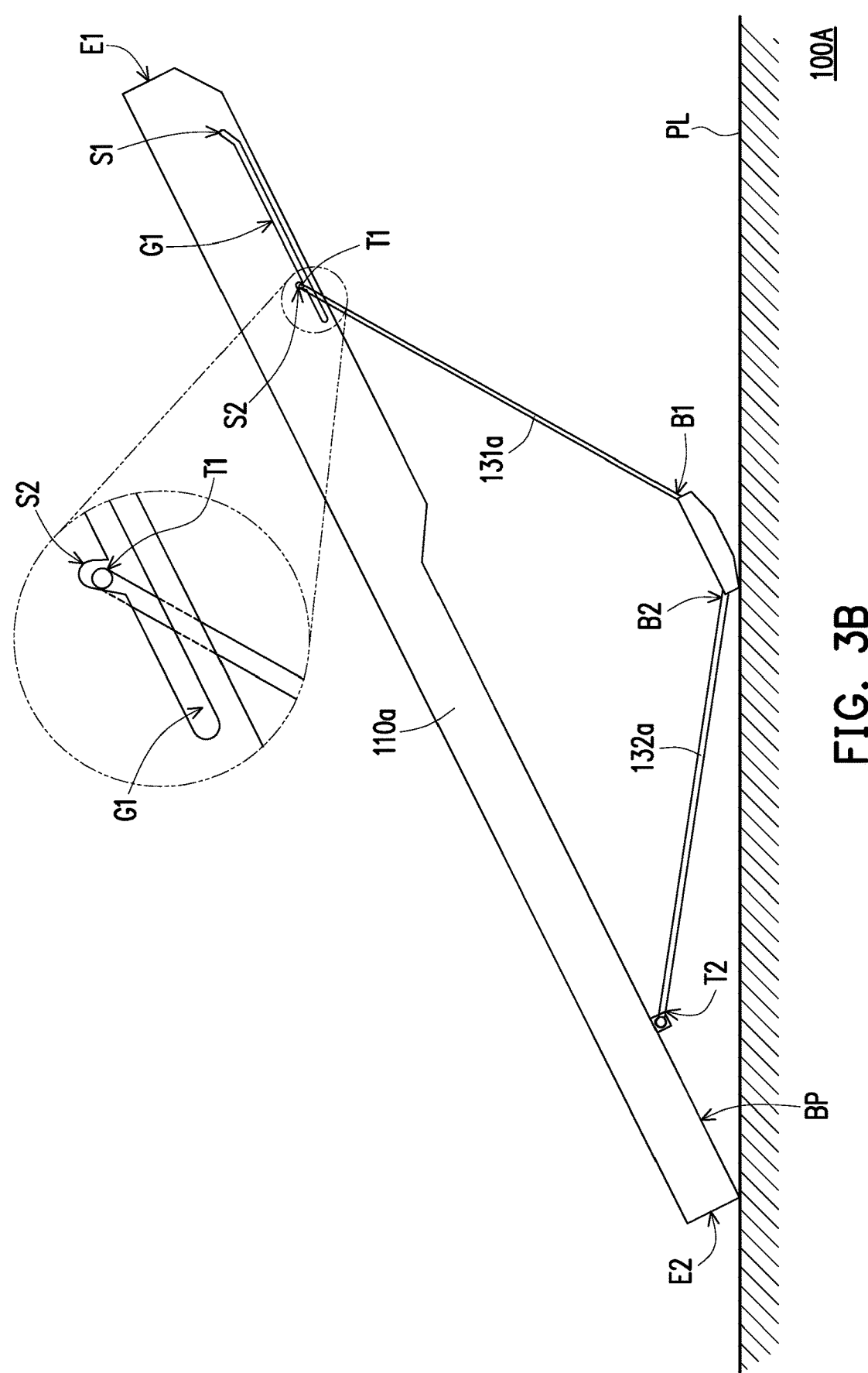
FIG. 3B is a schematic side view illustrating the electronic device in FIG. 3A is switched to the open mode.
Figure 3C:
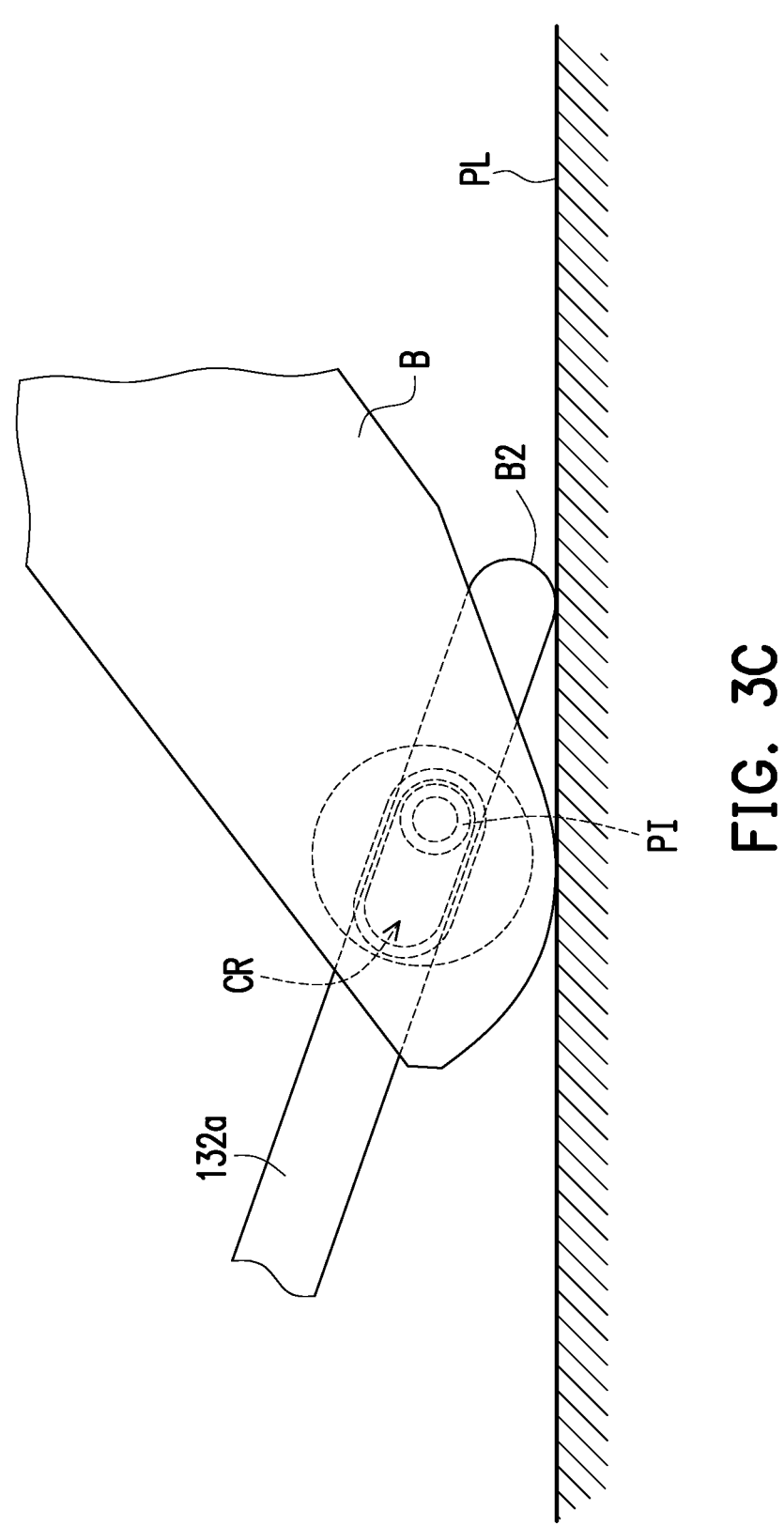
FIG. 3C is a schematic perspective view of some components of the electronic device in FIG. 3A.
Figure 3D:
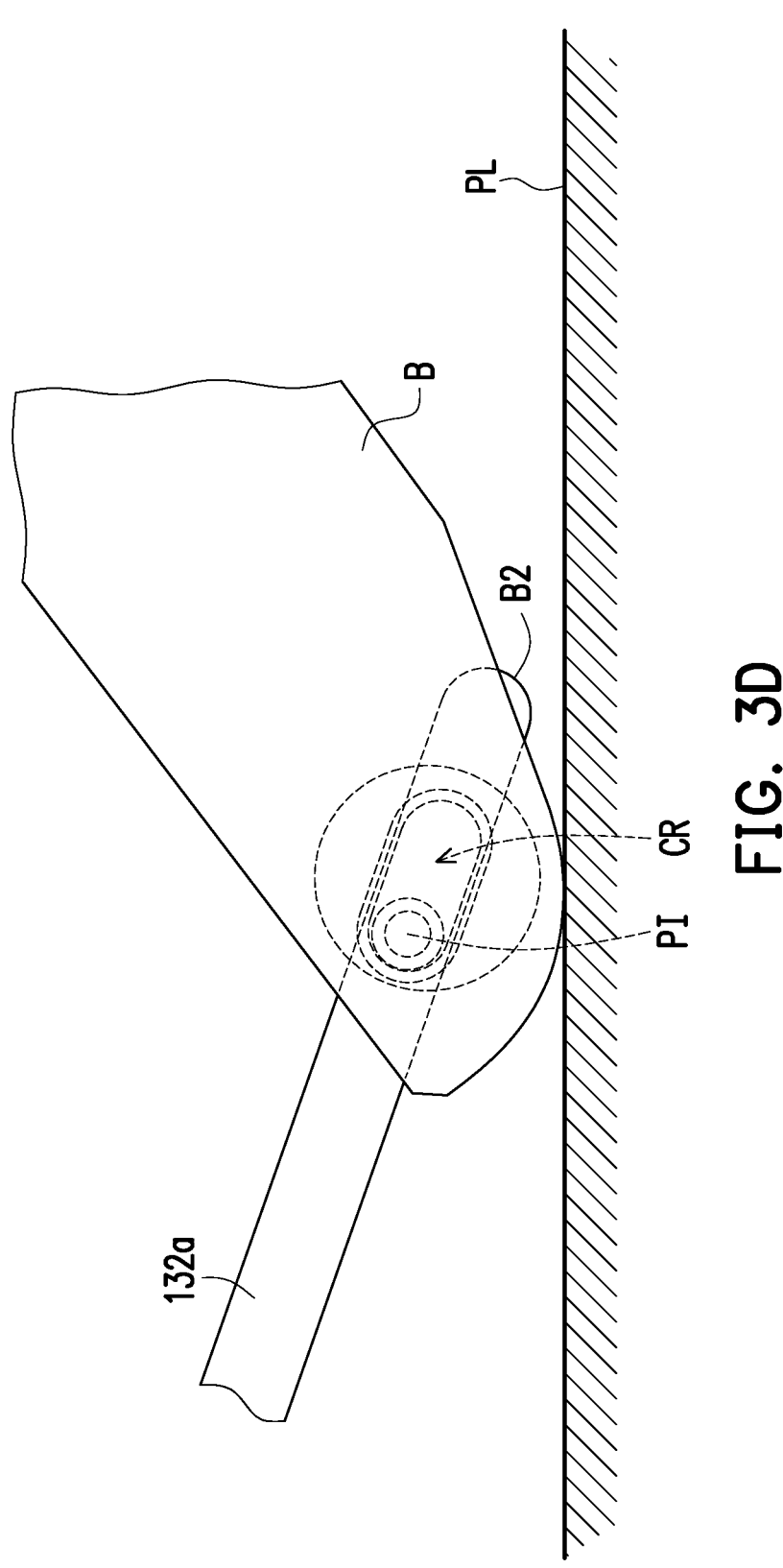
FIG. 3D is a schematic perspective view of some components of the electronic device in FIG. 3A.
Figure 3E:
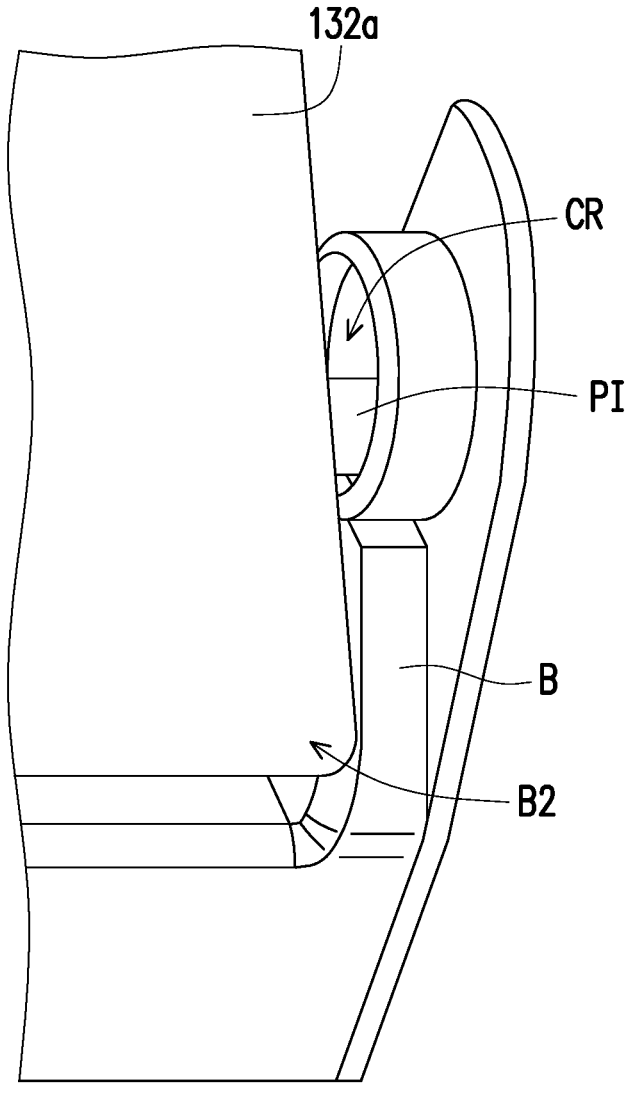
FIG. 3E is a schematic three-dimensional view of the electronic device in FIG. 3D at another angle.

FIG. 3A is a schematic side view of a bracket component of an electronic device combined with a first sliding rail according to another embodiment of the disclosure. FIG. 3B is a schematic side view illustrating the electronic device in FIG. 3A is switched to the open mode. FIG. 3C is a schematic perspective view of some components of the electronic device in FIG. 3A. FIG. 3D is a schematic perspective view of some components of the electronic device in FIG. 3A. FIG. 3E is a schematic three-dimensional view of the electronic device in FIG. 3D at another angle.

A bracket component 130a of an electronic device 100A provided in this embodiment has a first bracket 131a, a second bracket 132a, and a toggle element 133a. The first bracket 131a is adjacent to the first end portion E1. The second bracket 132a is adjacent to the second end portion E2 or the second bottom openings H2.

With reference to FIG. 3A and FIG. 3B, a first top end T1 of the first bracket 131a is slidably disposed in a first sliding groove G1 of the logic body 110a, and a first bottom end B1 of the first bracket 131a is pivoted to the stopper B. The first sliding groove G1 is adjacent to the first end portion E1. The toggle element 133a is connected to the first top end T1 of the first bracket 131a. A second top end T2 of the second bracket 132a is pivoted to the bottom portion BP of the logic body 110a, and a second bottom end B2 of the second bracket 132a is slidably disposed at the stopper B or a channel of the stopper B.

With reference to FIG. 3A, in the closed mode, the first top end T1 is latched to a first notch S1 of the first sliding groove G1, and the first notch S1 is adjacent to the first end portion E1.

With reference to FIG. 3B, in the open mode, the first top end T1 is latched to a second notch S2 of the first sliding groove G1. The second notch S2 is adjacent to the stopper B and away from the first notch S1. In the open mode, the first bracket 131a and the second bracket 132a are folded relative to the stopper B to drive the stopper B to be away from the bottom portion BP, and the second end portion E2 of the electronic device 100A and the stopper B are adapted to abut against an external plane PL, causing the logic body 110a to be disposed in an inclined orientation.

With reference to FIG. 3A and FIG. 3C, in the closed mode, the first bracket 131a and the second bracket 132a are folded to the bottom portion BP of the logic body 110a, and the second bottom end B2 of the second bracket 132a is stored in the stopper B.

With reference to FIG. 3B and FIG. 3D, in the open mode, the first bracket 131a and the second bracket 132a are unfolded from the bottom portion BP of the logic body 110a, and the second bottom end B2 of the second bracket 132a is stored in the stopper B.

With reference to FIG. 3C, FIG. 3D, and FIG. 3E, the stopper B has an inclined sliding rail CR. The second bracket 132a has a pin PI slidably disposed in the inclined sliding rail CR. The pin PI is adapted to move back and forth in the inclined sliding rail CR. A friction coefficient of the second bottom end B2 is smaller than a friction coefficient of the stopper B, and the friction coefficient of the stopper B is smaller than a friction coefficient of the first bottom end B1 of the first bracket 131a.

In the open mode, a user may drive the second bottom end B2 of the second bracket 132a to protrude out of the stopper B. Due to the smaller friction coefficient of the second bottom end B2, the second bottom end B2 is adapted to slide on the external plane PL. When the logic body 110a is moved to a fixed point, the second bottom end B2 of the second bracket 132a is then stored in the stopper B. Due to the larger friction coefficient of the stopper B, the stopper B is adapted to abut against the external plane PL.

Figure 4A:
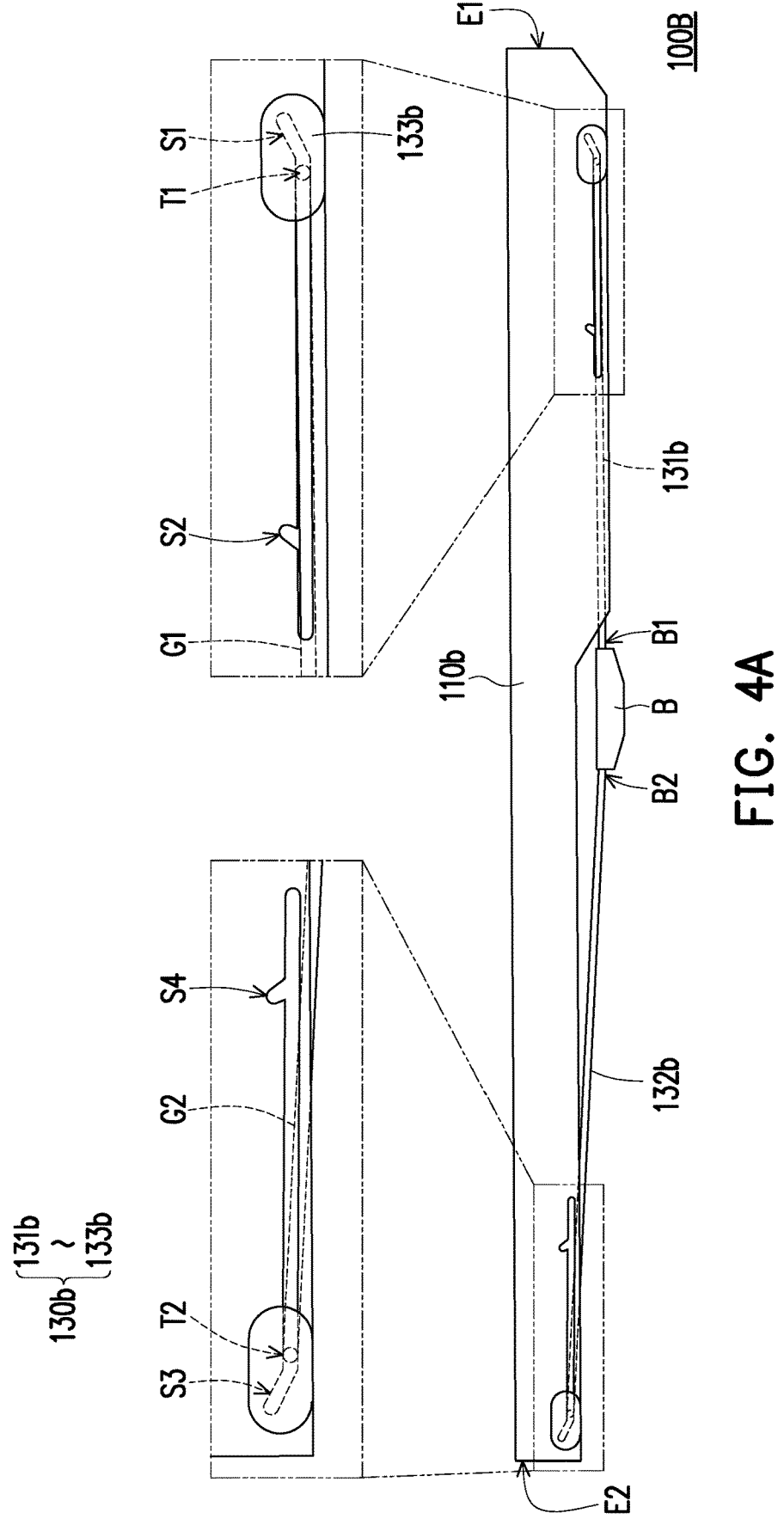
FIG. 4A is a schematic side view of a bracket component of an electronic device combined with a first sliding rail and a second sliding rail according to another embodiment of the disclosure.
Figure 4B:
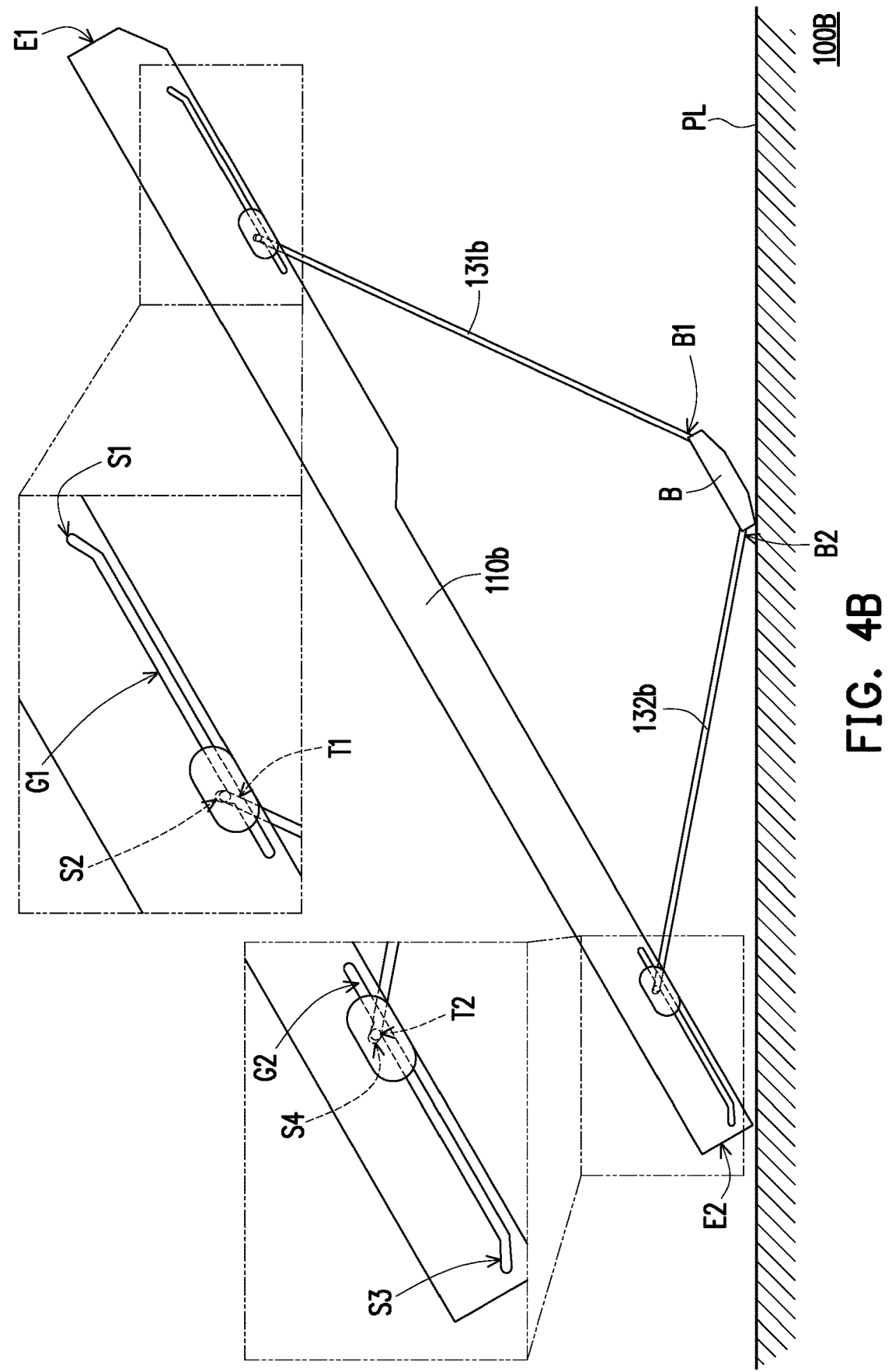
FIG. 4B is a schematic side view illustrating the electronic device in FIG. 4A is switched to the open mode.

FIG. 4A is a schematic side view of a bracket component of an electronic device combined with a first sliding rail and a second sliding rail according to another embodiment of the disclosure. FIG. 4B is a schematic side view illustrating the electronic device in FIG. 4A is switched to the open mode.

With reference to FIG. 4A and FIG. 4B, a bracket component 130b of an electronic device 100B provided in this embodiment includes a first bracket 131b, a second bracket 132b, and a toggle element 133b. The first bracket 131b is adjacent to the first end portion E1. The second bracket 132b is adjacent to the second end portion E2.

With reference to FIG. 4A and FIG. 4B, a first top end T1 of the first bracket 131b is slidably disposed in a first sliding rail G1 of a logic body 110b, and a first bottom end B1 of the first bracket 131b is pivoted to the stopper B. The first sliding rail G1 is adjacent to the first end portion E1. A second top end T2 of the second bracket 132b is slidably disposed in a second sliding rail G2 of the logic body 110b, and a second bottom end B2 of the second bracket 132b is pivoted to the stopper B. The toggle element 133b is connected to the first top end T1 of the first bracket 131b.

With reference to FIG. 4A, in the closed mode, the first top end T1 is latched to the first notch S1 of the first sliding rail G1, and the first notch S1 is adjacent to the first end portion E1. The second top end T2 is latched to a third notch S3 of the second sliding rail G2, and the third notch S3 is adjacent to the second end portion E2.

With reference to FIG. 4B, in the open mode, the first top end T1 is latched to the second notch S2 of the first sliding rail G1, the second notch S2 is adjacent to the stopper B and away from the first notch S1. The second top end T2 is latched to a fourth notch S4 of the second sliding rail G2, and the fourth notch S4 is adjacent to the stopper B and away from the third notch S3.

In the open mode, the first bracket 131b and the second bracket 132b are folded relative to the stopper B to drive the stopper B to be away from the bottom portion BP, and the second end portion E2 and the stopper B of the electronic device 100B are adapted to abut against an external plane PL, causing the logic body 110b to be disposed in an inclined orientation.

Figure 5A:
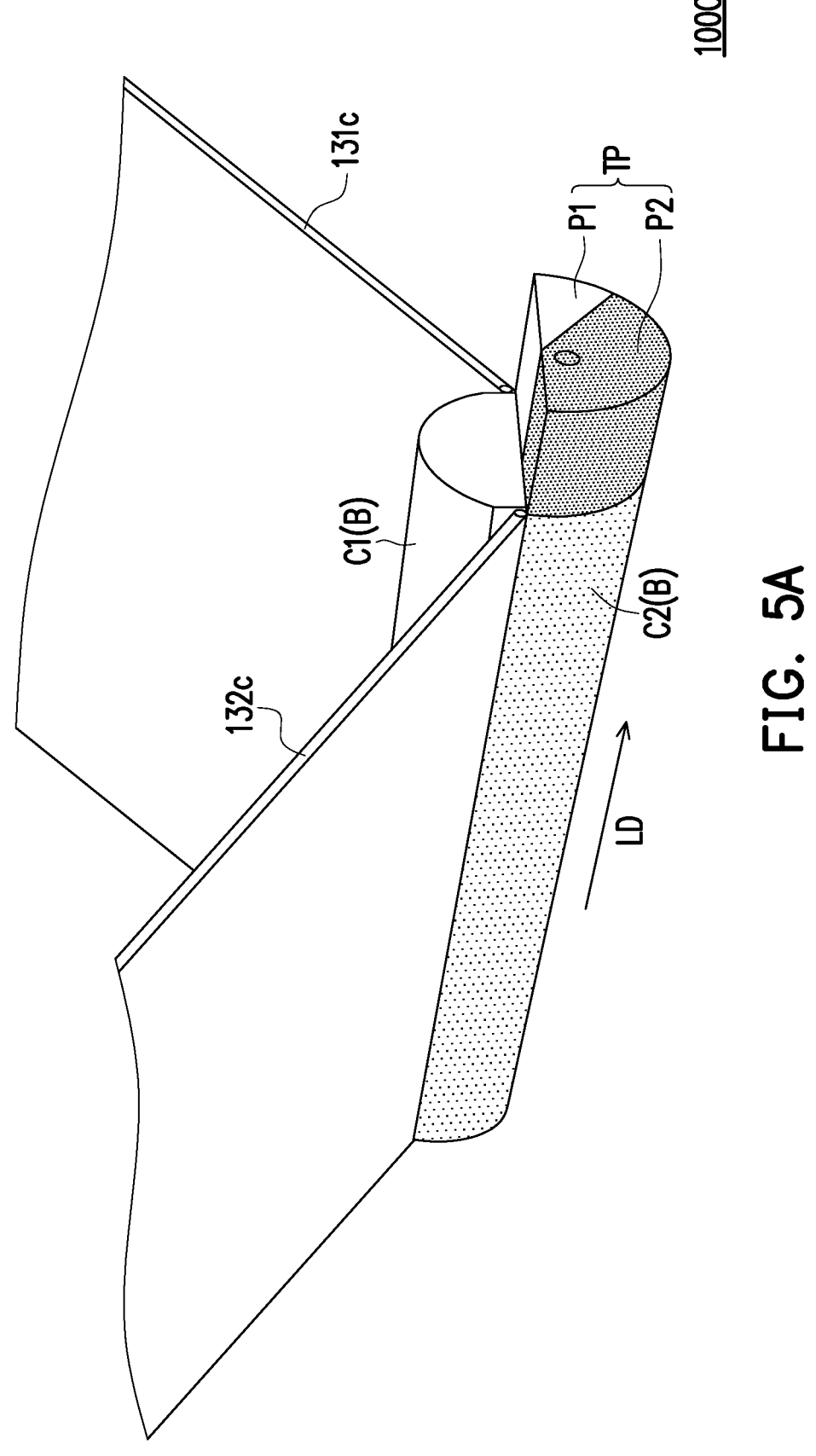
FIG. 5A is a schematic three-dimensional view of a bracket component of an electronic device combined with a rotating element according to another embodiment of the disclosure.
Figure 5D:
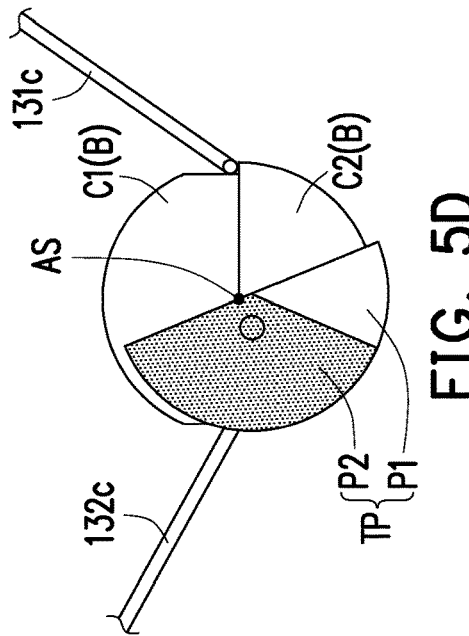
FIG. 5D is a schematic view illustrating a rotation action of the rotating element and the stopper in FIG. 5A.
Figure 5C:
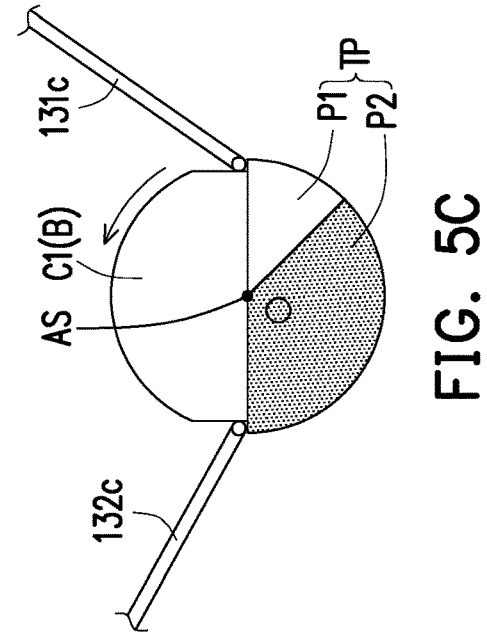
FIG. 5C is a schematic view illustrating the bracket component in FIG. 5A is rotated relative to the stopper.
Figure 5B:
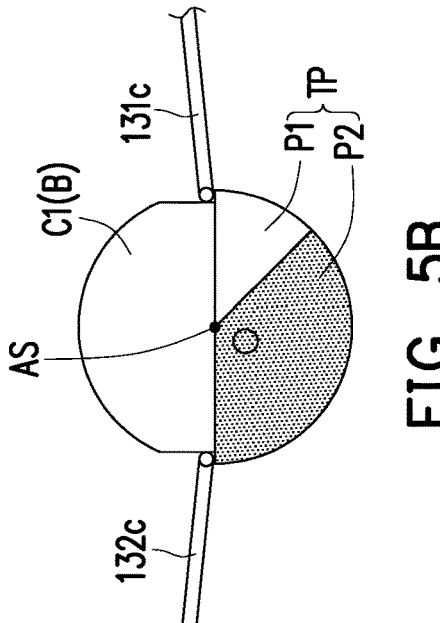
FIG. 5B is a schematic side view of the rotating element and the stopper in FIG. 5A.

FIG. 5A is a schematic three-dimensional view of a bracket component of an electronic device combined with a rotating element according to another embodiment of the disclosure. FIG. 5B is a schematic side view of the rotating element and the stopper in FIG. 5A. FIG. 5C is a schematic view illustrating the bracket component in FIG. 5A is rotated relative to the stopper. FIG. 5D is a schematic view illustrating a rotation action of the rotating element and the stopper in FIG. 5A.

With reference to FIG. 5A and FIG. 5B, an electronic device 100C provided in this embodiment includes a rotating element TP and a torsion spring. The rotating element TP is pivoted to a side end of the stopper B, and a location where the rotating element TP is pivoted to the side end deviates from a central axis AS of the stopper B. The torsion spring is disposed between the stopper B and the rotating element TP and configured to provide an elastic force to the rotating element TP, allowing the rotating element TP to automatically rotate to an initial position relative to the stopper B without any interference resulting from external forces.

Along a length direction LD of the stopper B, the rotating element TP protrudes from a first bracket 131c and a second bracket 132c. The stopper B includes an upper half C1 and a lower half C2, the first bracket 131c is pivoted to a first side of the upper half C1, the second bracket 132c is pivoted to a second side of the upper half C1, and the first and second sides of the upper half C1 have notches avoiding interference with the first bracket 131c and the second bracket 132c. A location where the rotating element TP is pivoted to a side end of the lower half C2 deviates from the central axis AS.

The rotating element TP includes a sliding portion P1 and a sliding stopper portion P2. The sliding stopper portion P2 is connected to the sliding portion P1, and the sliding portion P1 and the sliding stopper portion P2 form a semi-circular structure. Particularly, a friction coefficient of the sliding portion P1 is smaller than a friction coefficient of the sliding stopper portion P2. In this embodiment, the friction coefficient of the sliding portion P1 is smaller than a friction coefficient of the lower half C2 of the stopper B, a material of the sliding portion P1 is the same as a material of the upper half C1 of the stopper B, such as metal or plastic. A material of the lower half C2 of the stopper B is the same as a material of the sliding stopper portion P2, e.g., rubber.

With reference to FIG. 5B, in the closed mode, the first bracket 131c and the second bracket 132c are either approximately folded or completely folded to the bottom portion of the logic body, and the rotating element TP eccentrically rotates relative to the stopper B, causing the sliding stopper portion P2 to make contact with an external plane PL. In this embodiment, the bottom portion does not have any groove to avoid interference with the first bracket 131c and the second bracket 132c, so that the first bracket 131c and the second bracket 132c are approximately folded to the bottom portion of the logic body. In alternative embodiments, the bottom portion has a groove designed to avoid interference with the first bracket 131c and the second bracket 132c, allowing the first bracket 131c and the second bracket 132c are folded to the bottom portion of the logic body.

With reference to FIG. 5A and FIG. 5C, in the open mode, the first bracket 131c and the second bracket 132c are unfolded from the bottom portion of the logic body, and the rotating element TP eccentrically rotates relative to the stopper B, causing the sliding stopper portion P2 to make contact with the external plane PL.

On the premise that the electronic device 100C does not move, the electronic device 100C may be positioned on the external plane PL by having the sliding stopper portion P2 contact the external plane PL.

With reference to FIG. 5D, in the open mode, the first bracket 131c and the second bracket 132c are unfolded from the bottom portion of the logic body. The user is adapted to drive the rotating element TP to eccentrically rotate relative to the stopper B, causing the sliding portion P1 to make contact with the external plane PL and slightly lifting the stopper B to be away from the external plane PL. On this condition, the friction coefficient of the sliding portion P1 is smaller, and the lower half C2 of the stopper B does not contact the external plane PL, which is conducive to the sliding of the sliding portion P1 on the external plane PL. Such configuration aims at adjusting the position of the electronic device 100C on the external plane PL.

To sum up, the electronic device provided in one or more embodiments of the disclosure adopts the bracket component. In the closed mode, the bracket component is positioned close to the bottom portion to reduce the volume, and the electronic device is adapted to low-performance usage scenarios, such as browsing webpages or watching videos. In the open mode, the bracket component is unfolded from the bottom portion to increase the space for heat dissipation, and the electronic device is adapted to full-performance usage scenarios, such as gaming, drawing or programming.

To be specific, when the logic body is elevated by the bracket component and the stopper, the included angle between the logic body and the plane is ergonomically sound, allowing the user to use the keyboard of the logic body for extended periods.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
 a logic body, having a plurality of first end openings and a plurality of first bottom openings, wherein the first end openings are disposed at a first end portion of the logic body, and the first bottom openings are disposed at a bottom portion of the logic body and are adjacent to the first end portion;
 a processing unit, disposed in an interior of the logic body, away from the first end openings, and misaligned with the first bottom openings; and
 a bracket component, rotatably disposed at the bottom portion, wherein the bracket component comprises a stopper disposed at the bottom portion;
 a rotating element pivoted to a side end of the stopper, and the rotating element has a sliding portion and a sliding stopper portion connected to the sliding portion, wherein,
 in a closed mode, the bracket component is positioned close to the bottom portion and covers the first bottom openings, and
 in an open mode, the bracket component is unfolded from the bottom portion and exposes the first bottom openings.

2. The electronic device according to claim 1, wherein the logic body has a plurality of second bottom openings away from the first bottom openings.

3. The electronic device according to claim 2, further comprising a storage unit disposed in the interior and corresponding to the second bottom openings.

4. The electronic device according to claim 1, wherein the logic body has a plurality of third bottom openings adjacent to the first bottom openings.

5. The electronic device according to claim 4, wherein a size of the first bottom openings is smaller than a size of the third bottom openings.

6. The electronic device according to claim 4, wherein an aperture ratio of the first bottom openings is smaller than an aperture ratio of the third bottom openings.

7. The electronic device according to claim 4, wherein the processing unit corresponds to the third bottom openings.

8. The electronic device according to claim 4, wherein
 in the closed mode, the bracket component covers the third bottom openings; and
 in the open mode, the bracket component exposes the third bottom openings.

9. The electronic device according to claim 4, further comprising a heat dissipation fan disposed in the interior and corresponding to the third bottom openings.

10. The electronic device according to claim 1, further comprising a heat dissipation fin disposed in the interior and corresponding to the first bottom openings.

11. The electronic device according to claim 1, wherein the stopper is movably disposed at the bottom portion, and the bracket component is connected to the stopper and configured to drive the stopper to be spaced from the bottom portion.

12. The electronic device according to claim 1, wherein the bracket component comprises:
 a first bracket, both ends of which are respectively connected to the bottom portion and the stopper;
 a second bracket, both ends of which are respectively connected to the bottom portion and the stopper,
 wherein in the closed mode, the first bracket and the second bracket are positioned close to the bottom portion, and the first bracket and the second bracket are unfolded from the stopper;
 in the open mode, the first bracket and the second bracket are unfolded from the bottom portion, and the first bracket and the second bracket are folded to the stopper.

13. The electronic device according to claim 12, wherein the bracket component comprises an elastic element, both ends of which are respectively connected to the bottom portion and the stopper.

14. The electronic device according to claim 12, wherein the first bracket has a first top end slidably disposed at a first sliding rail of the logic body,
 in the closed mode, the first top end is latched to a first notch of the first sliding rail, the first notch is adjacent to the first end portion,
 in the open mode, the first top end is latched to a second notch of the first sliding rail, and the second notch is adjacent to the stopper and away from the first notch.

15. The electronic device according to claim 12, wherein the second bracket has a second bottom end slidably disposed at the stopper.

16. The electronic device according to claim 15, wherein the stopper has an inclined sliding rail.

17. The electronic device according to claim 16, wherein the second bracket has a pin slidably disposed at the inclined sliding rail.

18. The electronic device according to claim 15, wherein a friction coefficient of the second bottom end is smaller than a friction coefficient of the stopper.

19. The electronic device according to claim 12, wherein the second bracket has a second top end slidably disposed at a second sliding rail of the logic body, in the closed mode, the second top end is disposed at the second sliding rail, in the open mode, the second top end is latched to a fourth notch of the second sliding rail, and the fourth notch is adjacent to the stopper.

20. The electronic device according to claim 1, wherein a location where the rotating element is pivoted to the side end deviates from a central axis of the stopper.

21. An electronic device, comprising:

a logic body, having a plurality of first end openings and a plurality of first bottom openings, wherein the first end openings are disposed at a first end portion of the logic body, and the first bottom openings are disposed at a bottom portion of the logic body and are adjacent to the first end portion;

a processing unit, disposed in an interior of the logic body, away from the first end openings, and misaligned with the first bottom openings; and a bracket component, rotatably disposed at the bottom portion, wherein the bracket component comprises a stopper disposed at the bottom portion, and a second bracket, both ends of which are respectively connected to the bottom portion and the stopper;

the second bracket has a second bottom end slidably disposed at the stopper, the stopper has an inclined sliding rail, wherein, in a closed mode, the bracket component is positioned close to the bottom portion and covers the first bottom openings, and in an open mode, the bracket component is unfolded from the bottom portion and exposes the first bottom openings.

* * * * *